US011271558B2

(12) United States Patent
Djelassi-Tscheck et al.

(10) Patent No.: US 11,271,558 B2
(45) Date of Patent: Mar. 8, 2022

(54) SMART ELECTRONIC SWITCH

(71) Applicant: Infineon Technologies AG, Neubiberg (DE)

(72) Inventors: Christian Djelassi-Tscheck, Villach (DE); Ulisse Lorenzo Lillo, Villach (DE); Michael Luschin, Krumpendorf (AT)

(73) Assignee: Infineon Technologies AG, Neubiberg (DE)

(*) Notice: Subject to any disclaimer, the term of this patent is extended or adjusted under 35 U.S.C. 154(b) by 31 days.

(21) Appl. No.: 16/985,136

(22) Filed: Aug. 4, 2020

(65) Prior Publication Data

US 2021/0050850 A1 Feb. 18, 2021

(30) Foreign Application Priority Data

Aug. 12, 2019 (DE) .......................... 102019121685.0

(51) Int. Cl.
*H02H 3/00* (2006.01)
*H03K 17/082* (2006.01)
(Continued)

(52) U.S. Cl.
CPC ......... *H03K 17/0822* (2013.01); *H01H 71/04* (2013.01); *H01H 83/08* (2013.01); *H03K 17/6877* (2013.01)

(58) Field of Classification Search
CPC .... H01H 83/08; H01H 71/04; H03K 17/0822; H03K 17/693; H03K 17/6877; H03K 17/0027
(Continued)

(56) References Cited

U.S. PATENT DOCUMENTS 5,517,379 A * 5/1996 Williams ............. H02H 11/003
361/84
6,144,085 A 11/2000 Barker
(Continued)

FOREIGN PATENT DOCUMENTS

DE 102004063946 A1 3/2006
DE 102016100498 A1 7/2016
(Continued)

OTHER PUBLICATIONS

Oppenheim et al., Chapter 6, Section 6.3 Basic Structures for IIR Systems, Discrete-Time Signal Processing, 2nd Edition, 1999, pp. 359-361. (Applicant points out, in accordance with MPEP 609.94(a), that the year of publication, 1999, is sufficiently earlier than the effective U.S. filing date, so that the particular month of publication is not in issue.).
(Continued)

*Primary Examiner* — Jared Fureman
*Assistant Examiner* — Lucy M Thomas
(74) *Attorney, Agent, or Firm* — Shumaker & Sieffert, P.A.

(57) ABSTRACT

An integrated circuit that may be employed as a smart switch is described herein. The integrated circuit may include a first power transistor coupled between a supply pin and a first output pin and a second power transistor coupled between the supply pin and a second output pin. The first and the second power transistors each having an intrinsic body diode which allows reverse conduction. The integrated circuit further includes a control circuit that is configured to trigger a switch-on and switch-off of the first and the second power transistors based on a first input signal and a second input signal, respectively. Furthermore, the integrated circuit includes a protection circuit configured to detect, for the first and the second power transistors, a transition from a reverse
(Continued)

conducting state into a forward conducting state, and vice versa, and to generate an error signal in response to certain detections.

14 Claims, 6 Drawing Sheets

(51) Int. Cl.
  *H03K 17/687* (2006.01)
  *H01H 83/08* (2006.01)
  *H01H 71/04* (2006.01)
(58) Field of Classification Search
  USPC .......................................................... 361/101
  See application file for complete search history.

(56) References Cited

U.S. PATENT DOCUMENTS

| | | | |
|---|---|---|---|
| 7,279,765 | B2 | 10/2007 | Ahn et al. |
| 7,489,855 | B2 | 2/2009 | Kraus |
| 9,413,352 | B2 | 8/2016 | Lim |
| 9,672,201 | B1 | 6/2017 | Uszkoreit et al. |
| 9,887,532 | B2 | 2/2018 | Djelassi et al. |
| 10,305,363 | B1 | 5/2019 | Chen et al. |
| 2002/0024376 | A1 | 2/2002 | Sander |
| 2005/0184715 | A1 | 8/2005 | Kidokoro et al. |
| 2005/0270869 | A1 | 12/2005 | Krischke et al. |
| 2007/0008744 | A1 | 1/2007 | Heo et al. |
| 2012/0194119 | A1 | 8/2012 | Kroeze et al. |
| 2013/0301175 | A1 | 11/2013 | Posat |
| 2014/0078629 | A1 | 3/2014 | Cortigiani et al. |
| 2014/0091384 | A1 | 4/2014 | Petruzzi et al. |
| 2017/0063077 | A1 | 3/2017 | Donath et al. |
| 2017/0294772 | A1 | 10/2017 | Illing et al. |
| 2017/0294918 | A1 | 10/2017 | Illing et al. |
| 2017/0294922 | A1 | 10/2017 | Illing et al. |
| 2017/0366116 | A1 | 12/2017 | Ogawa et al. |
| 2018/0287365 | A1 | 10/2018 | Djelassi-Tscheck et al. |
| 2019/0356161 | A1* | 11/2019 | Wakazono ........... H03K 17/122 |
| 2020/0021207 | A1 | 1/2020 | Donat et al. |

FOREIGN PATENT DOCUMENTS

| | | |
|---|---|---|
| DE | 102015144460 A1 | 3/2017 |
| DE | 102017107520 A1 | 11/2017 |
| DE | 102017107523 A1 | 11/2017 |
| DE | 102017106896 A1 | 10/2018 |
| WO | 01/69784 A1 | 9/2001 |

OTHER PUBLICATIONS

Infineon Technologies AG, "BTN8962TA High Current PN Half Bridge NovalithIC™," Data Sheet, Rev 1.0, May 17, 2013, 26 pp.

International Standard ISO 7637-2, Third Edition, Mar. 1, 2011, entitled "Road vehicles-Electrical disturbances from conduction and coupling-Part 2: Electrical transient conduction along supply lines only," 48 pp.

International Standard ISO 26262-1, Second Edition, Dec. 2018, entitled "Road vehicles-Functional safety-Part 1: Vocabulary," 42 pp.

Office Action, in the German language, from counterpart German Application No. DE 10 2019 121 685.0, dated Apr. 29, 2020, 6 pp.

* cited by examiner

SMART ELECTRONIC SWITCH

This application claims priority to German Patent Application Number 102019121685.0, filed Aug. 12, 2019, the entire content of which is incorporated herein by reference.

TECHNICAL FIELD

The present disclosure relates to the field of smart semiconductor switches.

BACKGROUND

In many applications, electrical loads are switched on and off using semiconductor switches. Semiconductor switches that include supplemental circuitry in addition to the electronic switch as such (e.g. a power transistor) are usually referred to as smart electronic switches or simply smart switches. Examples of supplemental circuitry are a temperature sensor for detecting excess temperature, a load current sensor measuring the load current passing through the switch, a control logic that generates a control signal triggering a switch-on or switch-off dependent on an input signal and measured parameters such as the measured current and temperature, and interface circuit for outputting measured parameters, etc.

Smart switches are being increasingly used to replace conventional fuses in various applications. Smart switches that can be used as a substitute for fuses may be referred to as smart fuses or electronic fuses. Such smart switches may include circuitry that is configured to monitor the measured load current and to trigger a switch-dependent on the load current and a characteristic curve that represents a wire characteristic of a wire connecting the smart switch and an electric load. The wire characteristic stipulates when the control circuit is to trigger a disconnection of the load from the supply, in this case when an estimated wire temperature (relative to ambient temperature) exceeds a specified limit. Additionally, the above-mentioned supplemental circuitry included in a smart switch may provide a load current limitation function.

Smart switches with two or more output channels may include two or more power transistors which in some applications may cause problems, e.g. when the voltage of an output node of one of the channels increases (e.g. due to a short circuit or any other malfunction) to a voltage higher than the nominal operating voltage of the connected load.

SUMMARY

An integrated circuit that may be employed as a smart switch is described herein. In accordance with one embodiment the integrated circuit includes a first power transistor coupled between a supply pin and a first output pin and a second power transistor coupled between the supply pin and a second output pin. The first and the second power transistors each having an intrinsic body diode which allows reverse conduction. The integrated circuit further includes a control circuit that is configured to trigger a switch-on and switch-off of the first and the second power transistors based on a first input signal and a second input signal, respectively. Furthermore, the integrated circuit includes a protection circuit configured to detect, for the first and the second power transistors, a transition from a reverse conducting state into a forward conducting state, and vice versa, and to generate an error signal when detecting a transition from a reverse conducting state into a forward conducting state for the second power transistor and a transition from a forward conducting state into a reverse conducting state for the first power transistor.

Furthermore, a method for switching a load is described herein. In accordance with one embodiment the method includes switching on a first power transistor and a second power transistor, which are connected back-to-back, based on an input signal. The first and the second power transistors each have an intrinsic body diode which allows reverse conduction. The method further includes providing load current to the load connected to the second power transistor. An error signal for signaling an error is generated when detecting a transition from a reverse conducting state into a forward conducting state for the second power transistor and a transition from a forward conducting state into a reverse conducting state for the first power transistor.

BRIEF DESCRIPTION OF THE DRAWINGS

The invention can be better understood with reference to the following drawings and descriptions. The components in the figures are not necessarily to scale; instead emphasis is placed on illustrating the principles of the invention. Moreover, in the figures, like reference numerals designate corresponding parts. In the drawings.

DETAILED DESCRIPTION

Figure 1:
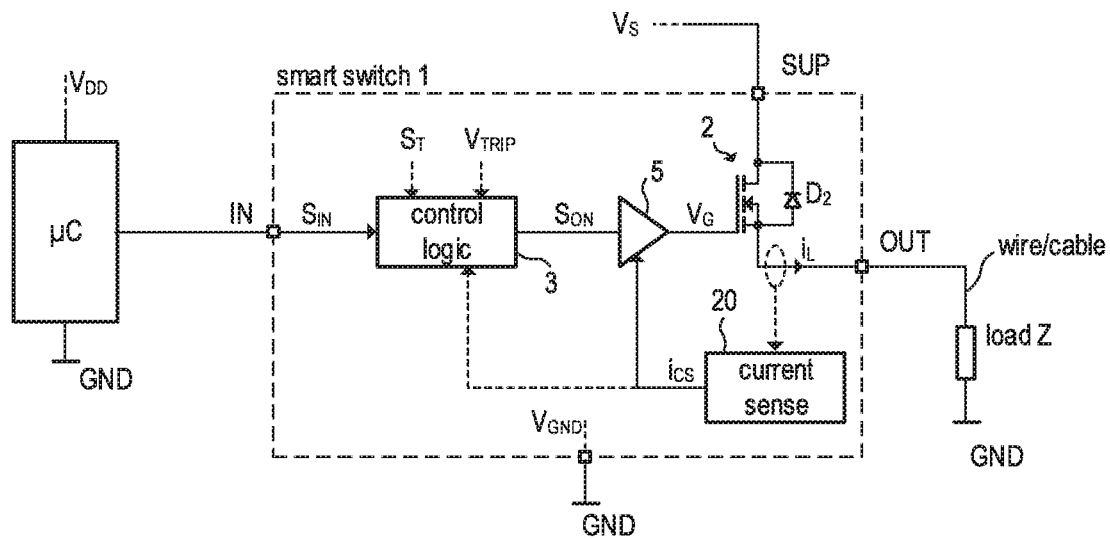
FIG. 1 illustrates a general example of a smart switch.

In the following detailed description, reference is made to the accompanying drawings. The drawings form a part of the description and, for the purpose of illustration, show examples of how the invention may be used and implemented. FIG. 1 illustrates one general example of an integrated smart switch circuit referred to as smart switch 1 in the following. The smart switch 1 may be integrated in a single semiconductor die arranged in a chip package. However, in some embodiments the smart switch 1 may include two or more semiconductor dies arranged in one chip package.

According to FIG. 1 the smart switch 1 includes an electronic switch 2, which may be a power transistor, e.g. a MOS transistor. DMOS transistors may be used as power transistors. Although the examples discussed herein use MOS transistors as power transistor 2 it is understood that a bipolar transistor may be used instead. A skilled person will have no problem applying the concepts described herein to bipolar transistors. The power transistor 2 is coupled between a supply pin SUP and an output pin OUT of the smart switch 1. Accordingly, the power transistor 2 can connect the output pin OUT to the supply pin SUP when switched on. Similarly, the power transistor 2 can disconnect the output pin OUT from the supply pin SUP when switched off. In other words, the power transistor 2 can enable and disable a load current path between the supply pin SUP and the output pin OUT in accordance with the gate signal VG applied to the transistor's gate electrode. It is understood that, if a bipolar transistor is used as power transistor, the transistor is switched on an off in accordance with a base current instead of a gate voltage.

In the example of FIG. 1, the gate signal VG is provided by a gate driver circuit 5, which is configured to output the gate signal VG in accordance with a control signal $S_{ON}$, which is a binary signal that may only assume a high level (e.g. indicating a switch-on) and a low level (e.g. indicating a switch-off). The control signal $S_{ON}$ is provided by a logic circuit, also referred to as control logic 3. The control logic 3 may include combinational and sequential logic circuits as well as synchronous and asynchronous circuits. The control logic 3 is configured to trigger a switch-on and a switch-off of the transistor 2 (by generating the control signal $S_{ON}$ with the appropriate logic level) based on the input signal $S_{IN}$, which is received at an input pin IN of the smart switch, and other parameters. The input signal $S_{IN}$ may be generated by an external (separate from the smart switch 1) circuit such as, for example, a microcontroller, labelled μC in the example of FIG. 1.

It is noted that the input signal $S_{IN}$ is not necessarily received at an input pin of the smart switch. In some embodiments the smart switch may have a digital communication interface, such as, for example, a Serial Peripheral Interface (SPI) or the like that allows to receive data (e.g. from a microcontroller) including switch-on and switch-off commands. In these embodiments, the smart switch may include circuitry that generates the input signal $S_{IN}$ and sets the logic level of the input signal $S_{IN}$ in accordance with the switch-on and switch-off commands received via the digital communication interface.

The above-mentioned other parameters that may be processed by the control logic 3 when generating the control signal $S_{ON}$ with a specific logic level may be, for example, a measured value representing the chip temperature, a measured value representing the load current, configurable threshold values (e.g. an over-temperature threshold), etc. The load current $i_L$ that is output at the output pin OUT to a load Z may be measured by a current sense circuit 20. The current sense circuit 20 may, for example, include a sense transistor coupled to power transistor 2 and operated in the same operating point. Current sensing using sense transistors is well known to a skilled person and thus not discussed in detail herein. For example, the power transistor may be composed of a plurality of transistor cells of a cell array, wherein one or a few transistor cells of the cell array may be used to form a sense transistor. In a simple embodiment, the current sense circuit may include a current sense resistor connected between a load terminal (e.g. the source terminal) of the transistor 2 and the output pint OUT. In this case the voltage drop across the current sense resistor is indicative of the load current and may be used as current sense signal. A further example of the above-mentioned parameters is a current threshold which may be used to implement an over-current shut-down function. For example, when the current sense signal CS provided by the current sense circuit 20 reaches or exceeds a critical current value represented by threshold value $V_{TRIP}$, then the control logic 3 triggers a switch-off of the transistor 2 until a switch-on is again triggered by the input signal $S_{IN}$.

In the example of FIG. 1, the smart switch 1 is configured as a high-side switch, i.e. the smart switch 1 is connected between a supply line providing the supply voltage $V_B$ (at supply pin SUP) and the load Z, which is connected to the output pin OUT. The smart switch 1 also has a ground pin GND to receive a reference potential $V_{GND}$, which may be defined as zero volts and which serves as constant reference potential for the circuitry included in the smart switch 1.

Figure 2:
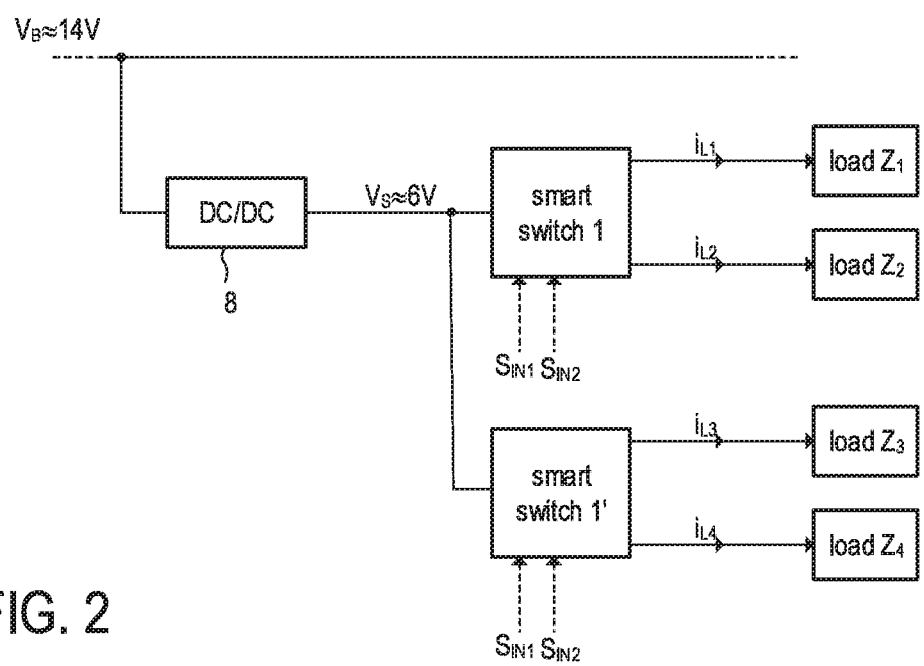
FIG. 2 illustrates one example of a circuit arrangement with a DC/DC converter that supplies several loads via several smart switches.

Smart switches may include more than one output channel in order to switch/protect two or more loads. FIG. 2 illustrates one example of a circuit topology which may be used, for example, in modern automotive systems in which numerous subsystems (represented by loads $Z_1$-$Z_4$) need to operate at a defined and stable supply voltage. According to the example of FIG. 2 a DC/DC converter 8 provides a pre-regulation of the supply voltage $V_S$, which may be significantly lower than battery voltage $V_B$. For example, the battery voltage may vary between 12-14 volts, whereas the supply voltage $V_S$ may be regulated to match a set-point of 6 volts. The smart switches that connect the output of the DC/DC converter 8 with the subsystems/loads $Z_1$-$Z_4$ may provide protective functions, such as an over-current protection, as well as diagnosis functions.

In the example of FIG. 2, the subsystems/loads $Z_1$ and $Z_2$ are supplied with the supply voltage $V_S$ via the two-channel smart switch 1. Similarly, the subsystems/loads $Z_3$ and $Z_4$ are supplied via the two-channel smart switch 1'. The supply pins SUP (see FIG. 1) of the smart switches are connected to the output of the DC/DC converter 8, and the outputs of the smart switches 1, 1' are connected to the subsystems/loads $Z_1$-$Z_4$ via corresponding cables. The smart switches may be controlled, e.g., by a microcontroller (cf. FIG. 1) or a similar device configured to generate the input signals $SIN_1$-$SIN_4$ to control the switching state of the output channels of the smart switches. The above-mentioned protective functions may also include a so-called electronic fuse function, which is basically an "intelligent" over-current switch-off function that does not use a fixed current threshold value but considers the energy dissipated in the cable between smart switch and load.

A circuit topology as shown in FIG. 2 entails some problems as commonly used smart switches do not provide reverse current protection. Generally, the term "reverse current" refers to a negative load current which may occur when the voltage at one output pin of a smart switch is higher than the supply voltage $V_S$ applied at the supply pin SUP. The problem of reverse current is further illustrated by the example illustrated in FIG. 3.

Figure 3:
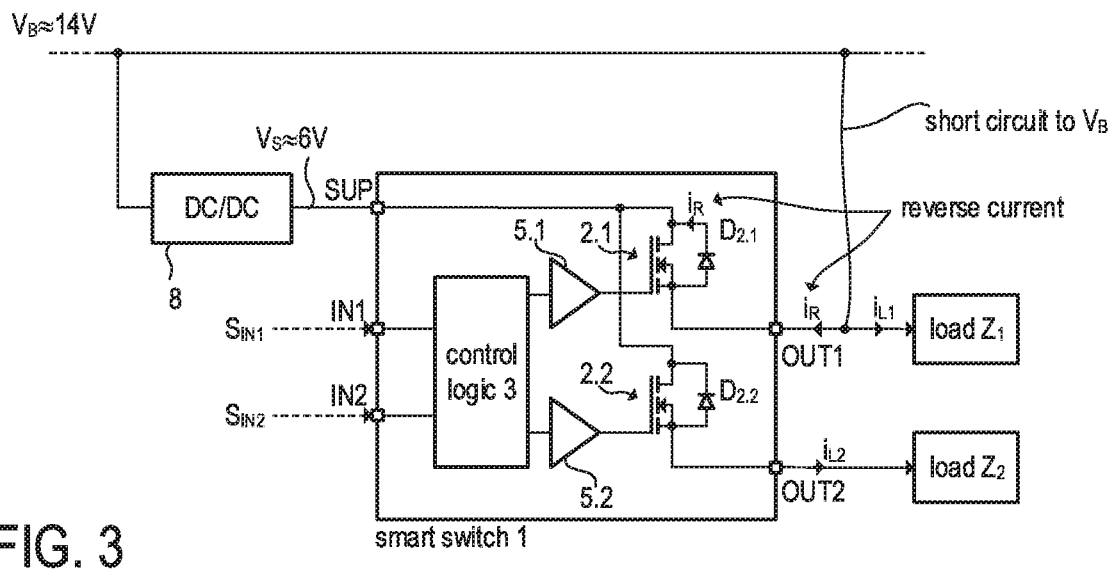
FIG. 3 illustrates a smart switch with two output channels, wherein the output of one of the output channels is raised to a high voltage (higher than the supply voltage of the smart switch) which causes reverse conduction.

FIG. 3 is a simplified block diagram of an integrated two-channel smart switch 1 that has a supply pin SUP, which may be connected to the output of the DC/DC converter 8, two input pins IN1 and IN2 (one for each channel) for receiving the input signals $S_{IN1}$ and $S_{IN2}$, and two respective output pins OUT1, OUT2, at which the loads $Z_1$ and, respectively, $Z_2$ are connected (e.g. via cables and connectors). The integrated circuit includes two transistors 2.1 and 2.2, which are coupled between the supply node and the respective output pins OUT1, OUT2. In the present example, the transistors 2.1 and 2.2 are MOS transistors, which have intrinsic body diodes $D_{2.1}$ and $D_{2.2}$, respectively. As can be seen in FIG. 3, the transistors 2.1 and 2.2 have a common drain electrode connected to the supply pin SUP.

The integrated two-channel smart switch 1 further includes a control circuit 3, which is also referred to as control logic, and may include, inter alia, combinational and sequential logic circuits as well as synchronous and asynchronous circuits. The control logic 3 is configured to trigger a switch-on and a switch-off of the transistors 2.1 and 2.2 (by generating the control signals, cf. control signal $S_{ON}$ in FIG. 1) based on the respective input signals $S_{IN1}$ and $S_{IN2}$, which are received at input pins IN1 and IN2, respectively, and other parameters. As mentioned, the input signals $S_{IN1}$ and $S_{IN2}$ may be generated by an external (separate from the smart switch 1) circuit such as, for example, a microcontroller (cf. FIG. 1, microcontroller µC). The control signals generated by the control logic 3 are supplied to gate drivers 5.1 and 5.2, which generate gate signals suitable to switch the respective transistors 2.1 and 2.2 on and off in accordance with the respective control signals. The function of gate drivers has already been discussed above in connection with FIG. 1 and reference is made to the respective description above. It is understood that circuitry not needed for the further discussion has been omitted in FIG. 3 in order to keep the illustration clear and simple. Nevertheless, the smart switch of FIG. 3 may include all the circuitry such as current sense circuits, temperature sensor, etc., that is commonly implemented in smart switches.

FIG. 3 illustrates a situation in which the voltage at the output pin OUT1 is raised towards the voltage $V_B$, which may be significantly higher than the supply voltage $V_S$ ($V_B \gg V_S$). Such a situation may occur due to a short circuit in the cable connecting the output pin OUT1 and the subsystem/load $Z_1$, a malfunction of subsystem/load $Z_1$, or the like. As can be seen in FIG. 3, a reverse current $i_R$ (which has the opposite sign as the load current $i_{L1}$) may flow through the (now forward-biased) body diode $D_{2.1}$ of transistor 2.1. As a result, the voltage at the supply pin SUP is also raised towards $V_B$, and all subsystems/loads connected to the output of the DC/DC converter 8 (see FIG. 2, loads $Z_1$-$Z_4$) will "see" an overvoltage up to the battery voltage $V_B$ minus the voltage drop across diode $D_{2.1}$. It is self-evident that such a situation may, in the worst case, cause a failure of all loads/subsystems supplied via the DC/DC converter 8. This problem is not limited to two-channel smart switches but can also occur when using single channels smart switches to connect various loads to the output of the DC/DC converter 8.

One approach to alleviating the above-mentioned problem and to protecting the individual subsystems would be to connect a diode between each smart switch and the output of the DC/DC converter 8. However, this would require additional parts (and thus increase the costs of the overall system) and, even more critical, this would entail significant power losses in the additional diodes. Furthermore, such an approach does not allow a detection of a reverse current situation and an identification of the defective load or cable.

Figure 4:
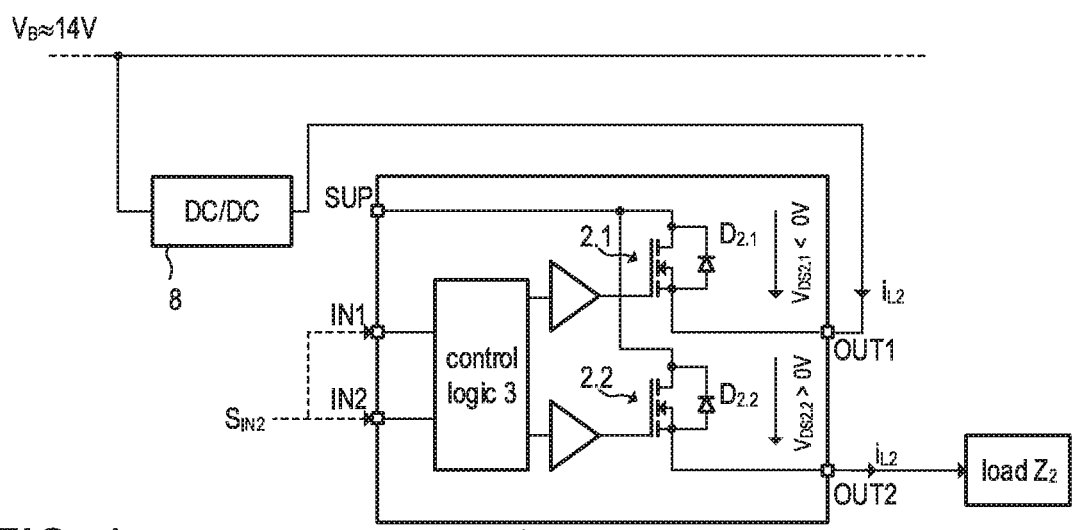
FIG. 4 illustrates the smart switch of FIG. 3 in a novel configuration, in which the supply pin is not connected, the supply voltage is applied at the output of one output channel, and a load is connected to the output of the other output channel.

The example of FIG. 4 illustrates one innovative way of using a smart switch with two or more output channels which allows the identification of a reverse current situation and the blocking of a reverse current without causing significant additional losses. The smart switch 1 of FIG. 4 is basically the same as smart switch of FIG. 3. However, the supply pin SUP is not connected, and the supply voltage $V_S$ is instead applied to one of the output pins, output pin OUT1 in the present example. A load $Z_2$ is connected to the other output pin OUT2. As the supply pin SUP is not connected, the two transistors 2.1 and 2.2 are connected "back-to-back" (i.e. connected in series with the drain electrodes of the transistors connected to each other at a common circuit node).

As can be seen from FIG. 4, both transistors 2.1, and 2.2, have to be switched on to supply the load $Z_2$. For this purpose, the same input signal $S_{IN2}$ may be applied at the input pins IN1 and IN2 to switch on the transistors 2.1, and 2.2 simultaneously. During normal operation (i.e. while the transistors 2.1, and 2.2 are in an on-state to supply the load $Z_2$ and no short-circuit is present), transistor 2.1 operates in a reverse-conducting state, which means that the drain-source-voltage $V_{DS2.1} = i_{L2} \cdot R_{ON}$ at transistor 2.1 is negative because the load current $i_{L2}$ is negative form transistor's 2.1 perspective ($R_{ON}$ is the on-resistance of the transistors). Generally, a load current is defined to be positive when flowing from drain to source (which is the case for transistor 2.2 in FIG. 4) and negative when flowing from source to drain (which is the case for transistor 2.1 in FIG. 4); a negative load current entails a negative drain-source voltage. Transistor 2.2 operates in a forward-conducting state.

Figure 5:
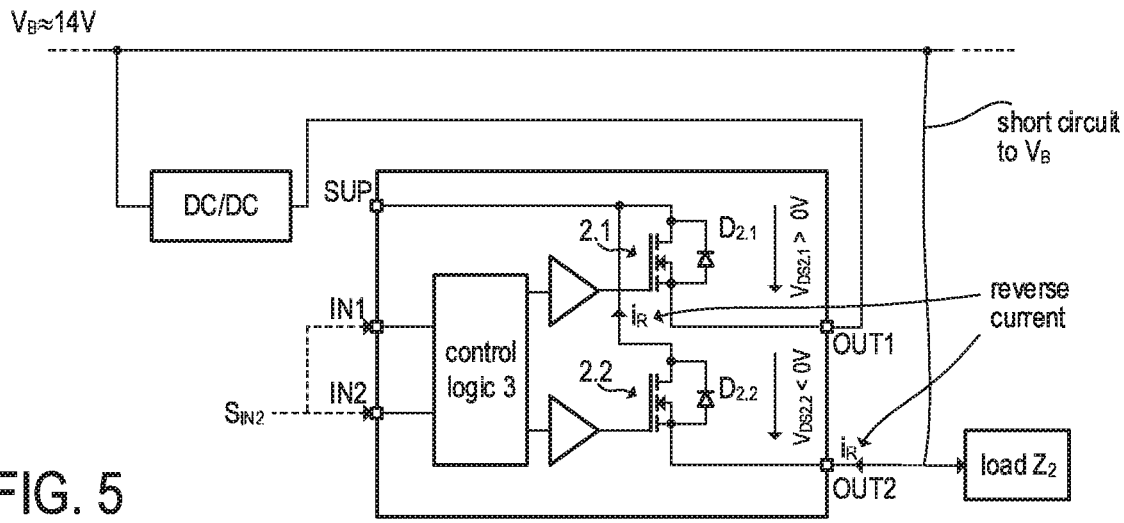
FIG. 5 illustrates the smart switch of FIG. 4 in a reverse conducting state.

FIG. 5 illustrates the same circuit arrangement as shown in FIG. 4 (smart switch 1 connecting the output of DC/DC converter 8 with load $Z_2$). However, FIG. 5 illustrates a situation in which the output pin OUT2 is pulled towards higher voltages (higher than the supply voltage $V_S$), which causes a reverse current. As discussed above with reference to FIG. 3, such a reverse current situation may occur due to a short circuit or a malfunction of the subsystem/load $Z_2$.

In a reverse current situation in which, in the present example of FIG. 5, a current $i_R$ is injected at output pin OUT2 due to a short circuit between the output pin and battery voltage $V_B$, transistor 2.2 operates in a reverse-conducting state while transistor 2.1 operates in a forward-conducting state. One example of how a reverse current situation can be detected by the control logic 3 is illustrated by the timing diagrams of FIG. 6. Before discussing FIG. 6 in more detail, it should be noted that $i_{S1}$ and $i_{S2}$ denote current sense signals representing the load currents (drain-source-currents) passing through the transistors 2.1 and, respectively, 2.2 (see FIG. 6, third and fourth diagram). Further, it is assumed, for the present example, that the current sense circuits used to generate the current sense signals $i_{S1}$ and $i_{S2}$, are only capable of measuring positive load currents (i.e. when the transistor is in a forward-conducting state) and the current sense signals $i_{S1}$ and $i_{S2}$ are zero when the respective transistors 2.1 and, respectively, 2.2 are in a reverse-conducting state.

Figure 6:
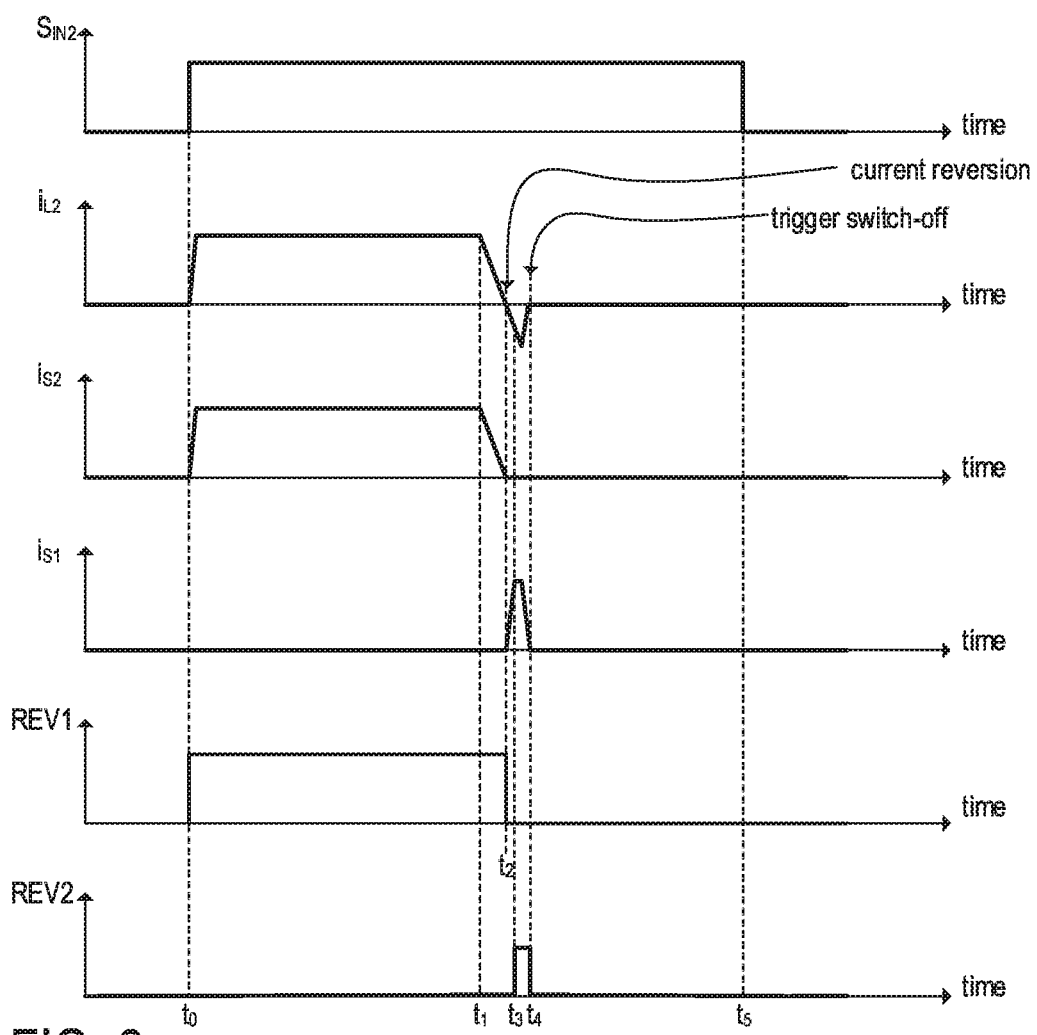
FIG. 6 shows timing diagrams illustrating the behavior of the smart switch of FIGS. 4 and 5 during reverse conduction and the detection of output current reversion.

According to the example of FIG. 6, the input signal $S_{IN2}$ is set to a high level (e.g. by an external microcontroller) at time instant $t_0$ to indicate that the smart switch 1 is to be switched on (see FIG. 6, first/top diagram). Accordingly, the control logic 3 (see FIGS. 4 and 5) will generate suitable control signals and the gate drivers 5.1 and 5.2 will generate respective gate signals to switch both transistors, 2.1 and 2.2, on. As a result, the output current $i_{L2}$ output to the load at output pin OUT2 rises steeply starting at time instant $t_0$. It is noted that the delay between the rising edge in input signal $S_{IN2}$ and the actual switch-on of the transistors 2.1 and 2.2 is very small and is therefore neglected in the present discussion. The current sense signal $i_{S2}$ follows the output current $i_{L2}$ as the respective transistor 2.2 is in a forward conducting state. The current sense signal $i_{S1}$ remains zero as, shortly after time instant $t_0$, the respective transistor 2.1 enters a reverse conducting state (see FIG. 6, third and fourth diagram). The fifth and the sixth diagram of FIG. 6 illustrate the logic states REV1 and REV2 (e.g. the value of a register included in the control logic 3), which indicate whether the respective transistors 2.1 and 2.2 are in a reverse conducting state or not, wherein REV2=1 indicates that transistor 2.2 is in a reverse conducting state, whereas REV2=0 indicates that transistor 2.2 is in a forward conducting state. Similarly, REV1 indicates the state of transistor 2.1.

The logic circuit 3 may be configured to evaluate the current sense signals $i_{S1}$ and $i_{S2}$ (e.g. using comparators) and set REV2 to a high level (indicating reverse conduction) when $S_{IN2}=1$ and the respective current sense signal $i_{S2}$ is approximately zero ($i_{S2} \approx 0A$). Similarly, REV2 is set to a low level (indicating forward conduction) when $S_{IN2}=1$ and the respective current sense signal $i_{S2}$ is positive ($i_{S1}>0A$). The same can be done for REV1. Accordingly, at time instant $t_0$ the logic state REV1 changes from a low level (logic 0) to a high level (logic 1), wherein the state REV2 remains low (logic 0), which means that transistor 2.2 is in a forward conducting state and transistor 2.1 is in a reverse conducting state.

Somewhat later, at time instant $t_1$, the output current $i_{L2}$ starts to drop and the sign of the output current reverses at time instant $t_2$. Accordingly, the current sense signal $i_{S2}$ drops to zero and remains zero after time instant $t_2$. Starting from time instant $t_2$ the current sense signal $i_{S1}$ starts to rise as the current $i_{L2}$ drops to more negative values. As a result, the logic state REV1 changes to REV1=0 at time instant $t_2$ (as $i_{S2}$ starts to rise), and immediately after, at time instant $t_3$, the logic state REV2 changes to REV2=1 (as $i_{S1}$ reaches and remains zero). A protection circuit (which may be part of the control logic 3) is configured to detect the current reversion by detecting the 1-to-0 transition in REV1 and the 0-to-1 transition in REV2 practically at the same time and to trigger an automatic switch-off of at least transistor 2.1 (better both transistors 2.1 and 2.2) to prevent continued reverse conduction. The short delay between time instant $t_2$ and time instant $t_3$ illustrates the fact that that current through the transistor and thus the logic states REV1, REV2 cannot change in zero time.

Figure 7:
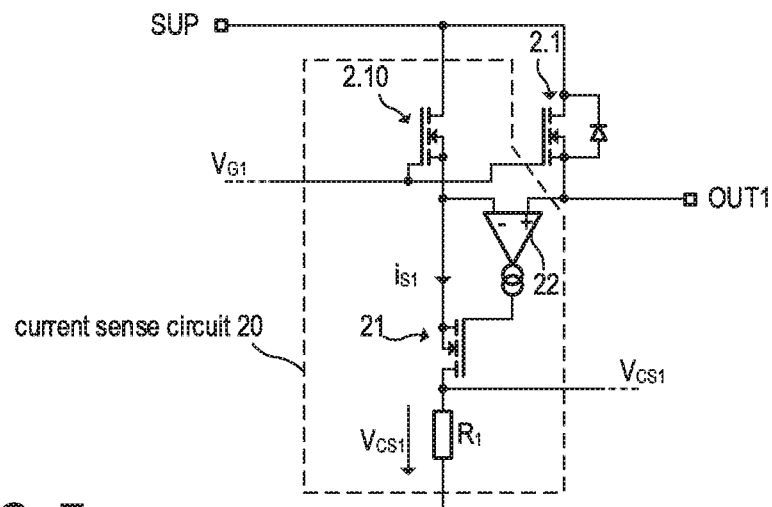
FIG. 7 illustrates one example of a current sense circuit which may be used to sense the load current passing through a transistor.

FIG. 7 illustrates one example of how the mentioned current sense circuit may be implemented (cf. FIG. 1, current sense circuit 20). In a smart switch with two or more channels, one current sense circuit may be provided for each output channel. Alternatively, one current sense circuit may be used to alternatingly sense the current passing through the transistors. According to the example of FIG. 7, a so-called sense-transistor 2.10 is coupled to the power transistor 2.1 so that power transistor 2.1 and sense transistor 2.10 "see" the same gate voltage $V_{G1}$ and the same drain voltage. Accordingly, power transistor 2.1 and sense transistor 2.10 have a common drain electrode and a common gate electrode. The active area of the sense-transistor 2.10 is smaller than the active area of the power transistor 2.1. The ratio of the active areas is known. In one example, the power transistor 2.1 is composed of a plurality of transistor cells of a cell array, wherein one transistor cell or a couple of transistor cells form the sense transistor 2.10. The source current $i_{S1}$ of the sense transistor 2.10 is proportional to the load current passing through the power transistor 2.1 when both, power transistor 2.1 and sense transistor 2.10, operate in the same operating point, which is the case when the drain-source voltages and the gate-source voltages are equal. In the example of FIG. 7, the source-drain current path of a p-channel MOS transistor 21 is coupled in series of the (n-channel) sense transistor 2.10, and the gate of the transistor 21 is driven such (by transconductance operational amplifier 22) that the source potentials of power transistor 2.1 and sense transistor 2.10 are equal. The current $i_{S1}$ is also referred to as sense current and may be converted into a respective current sense voltage $V_{CS1}$ using a resistor R1 coupled between the transistor 21 and ground potential GND.

It is noted that the circuit of FIG. 7 should be regarded as an illustrative exemplary implementation of the current sense circuit 20, which is as such known and thus not discussed in further detail herein. It is understood that various other known implementations exist which could be used instead. FIG. 7 illustrates an analog implementation of the current sense circuit 20. It is noted that digital implementations that provide a stream of digital values as current sense signal are also known. As mentioned above, the current sense circuit of FIG. 7 is not able to operate correctly when the power transistor 2.1 is in a reverse conducting state and thus the current sense signal $V_{CS1}$ (or $i_{S1}$) will be zero during reverse conduction of the power transistor 2.1.

Figure 8:
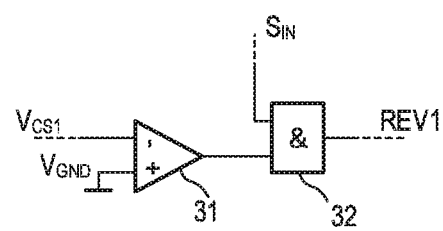
FIG. 8 illustrates one example of detecting reverse conduction of a transistor using the respective current sense signal.

FIG. 8 illustrates one example of how the logic states (Boolean value) REV1 and REV2 (see FIG. 6) may be generated based on the current sense signals $i_{S1}$ and $i_{S2}$ that represent the current passing through the transistors 2.1 and 2.2 (see FIG. 4). FIG. 8 covers the generation of the logic state REV1. It is understood that REV2 may be determined in an analogous way. According to the depicted example, REV1 is the AND-conjunction (see FIG. 8, and gate 32) of the input signal $S_{IN}$ and the result of the comparison $V_{CS1} \leq V_{GND}$ (see FIG. 8, comparator 32). In other words, REV1 will indicate a reverse conduction of transistor 2.1 when the input signal $S_{IN1}$ is "1" (i.e. transistor is to be switched on) and the load current passing through the transistor is not positive.

Figure 9:
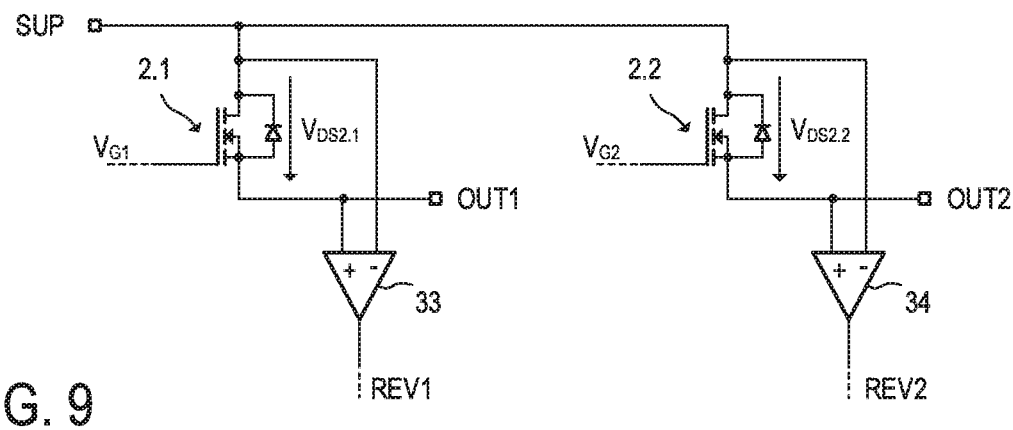
FIG. 9 illustrates one example of detecting reverse conduction of a transistor by monitoring the respective drain-source voltages.

The example of FIG. 9 illustrates an alternative example of how a reverse conduction of a transistor may be detected. FIG. 9 illustrates the transistors 2.1 and 2.2 of the smart switch of FIG. 4, wherein drain and source electrodes of transistor 2.1 are connected to the inputs of comparator 33. Similarly, drain and source electrodes of transistor 2.2 are connected to the inputs of comparator 34. The output of comparator 33 represents the Boolean value REV1 and will be "1" when the drain-source voltage $V_{DS2.1}$ is negative, and "0" when the drain-source voltage $V_{DS2.1}$ is positive. Similarly, the output of comparator 34 represents the Boolean value REV2 and will be "1" when the drain-source voltage $V_{DS2.2}$ is negative, and "0" when the drain-source voltage $V_{DS2.2}$ is positive.

Figure 10:
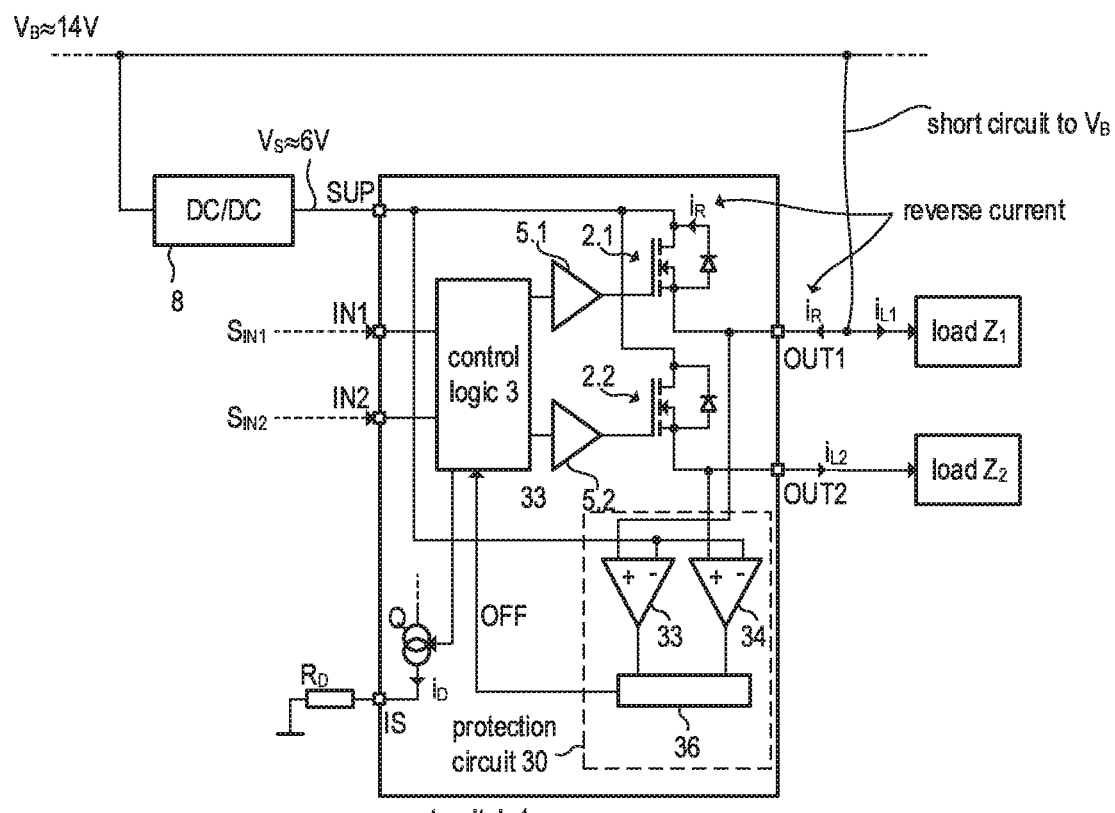
FIG. 10 illustrates the example of FIG. 4 in more detail.

FIG. 10 illustrates the smart switch of FIG. 4 in more detail. In particular, the smart switch includes a protection circuit that is configured to detect the output current reversal. That is, the protection circuit 30 is configured to detect, for both power transistors 2.1 and 2.2, a transition from a reverse conducting state into a forward conducting state and vice versa. The detection of a reverse condition is implemented as explained above with reference to FIG. 9. Alternatively, the detection may be based on the current sense signals as discussed above with reference to FIGS. 7 and 8. The actual reversal of the output current is detected by logic circuit 36, which is configured to combine the logic states REV1 and REV2 and to provide an output signal OFF indicating when transitions occurred in both states REV1 and REV2 within a short time.

The signal OFF provided by the protection circuit is processed by the control logic 3, which triggers a switch-off of both transistors 2.1 and 2.2 when the signal OFF indicates an output current reversion. Additionally, the control logic 3 may control a current source Q to output a diagnosis current $i_D$ at a dedicated diagnosis pin IS to indicate an error. The diagnoses current $i_D$ may be converted into a respective voltage by connecting a resistor RD to the diagnosis pin IS. The voltage drop across the resistor RD is proportional to the diagnosis current and may be read in, e.g. by an analog-to-digital converter included in the microcontroller that also provides the input signal $S_{IN2}$ (see FIG. 2). The level of the diagnosis current may be indicative of a specific error such as the output current reversal discussed herein.

Figure 11:
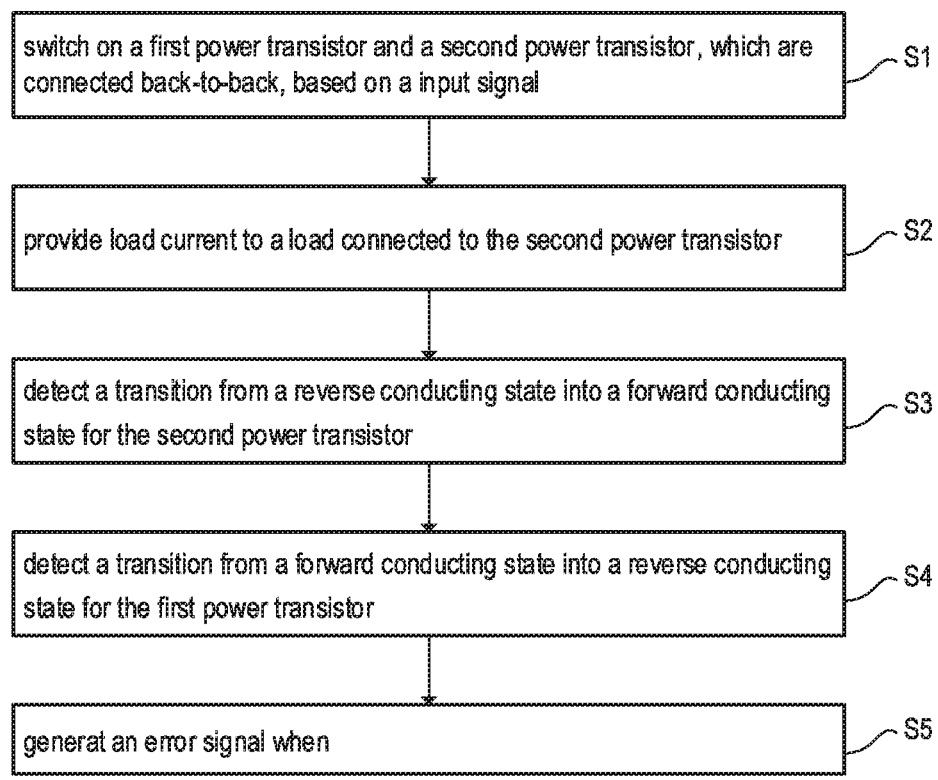
FIG. 11 is a flow chart illustrating one example of a method for detecting reverse conduction in a smart switch.

FIG. 11 is a flow chart illustrating one example of a method for detecting reverse conduction in a smart switch. According to FIG. 11, the method includes switching on—in accordance with an input signal—a first power transistor (e.g., FIG. 10, transistor 2.1) and a second power transistor (e.g., FIG. 10, transistor 2.1), which are connected back-to-back (see FIG. 11, step S1). The first and the second power transistors each have an intrinsic body diode which allows reverse conduction of the respective transistor. Further, the method includes providing load current (output current) to a load connected to the second power transistor (see FIG. 11, step S2). The method further includes detecting a transition from a reverse conducting state into a forward conducting state for the second power transistor (see FIG. 11, step S3) and a transition from a forward conducting state into a reverse conducting state for the first power transistor (see FIG. 11, step S4). It is understood that steps S3 and S4 may be interchanged or performed simultaneously. An error signal (e.g. FIG. 10, error signal OFF) is generated upon detection of transition from a reverse conducting state into a forward conducting state for the second power transistor and a transition from a forward conducting state into a reverse conducting state for the first power transistor.

Although the invention has been illustrated and described with respect to one or more implementations, alterations and/or modifications may be made to the illustrated examples without departing from the spirit and scope of the appended claims. For example, the logic levels used to trigger a specific action may be inverted as compared to the depicted examples. Logic gates may be replaced by other logic circuits that perform substantially the same function, etc. In particular regard to the various functions performed by the above described components or structures (units, assemblies, devices, circuits, systems, etc.), the terms used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

The invention claimed is:

1. An integrated circuit comprising:
   a first power transistor coupled between a supply pin and a first output pin,
   a second power transistor coupled between the supply pin and a second output pin, the first and the second power transistors each having an intrinsic body diode which allows reverse conduction;
   a control circuit configured to trigger a switch-on and switch-off of the first and the second power transistors based on a first input signal and a second input signal, respectively; and
   a protection circuit configured to detect, for the first and the second power transistors, a transition from a reverse conducting state into a forward conducting state, and vice versa, and to generate an error signal when detecting a transition from a reverse conducting state into a forward conducting state for the second power transistor and a transition from a forward conducting state into a reverse conducting state for the first power transistor.

2. The integrated circuit of claim 1,
   wherein the protection circuit is configured to generate the error signal when detecting the transition from a reverse conducting state into a forward conducting state for the second power transistor immediately followed by the transition from a forward conducting state into a reverse conducting state for the first power transistors.

3. The integrated circuit of claim 1, further comprising:
   a current sense circuit configured to generate a first current sense signal representing a load current passing through the first power transistor when in a forward conducting state and a second current sense signal representing a load current passing through the second power transistor when in a forward conducting state.

4. The integrated circuit of claim 3,
   wherein the first and the second current sense signals are zero when the first and, respectively, second power transistors are in a reverse conducting state.

5. The integrated circuit of claim 3,
   wherein the protection circuit is configured to detect, for the first and the second power transistors, the transition from the reverse conducting state into the forward conducting state, and vice versa, based on the first and, respectively, the second current sense signals.

6. The integrated circuit of claim 1,
   wherein the protection circuit is configured to detect, for the first and the second power transistors, the transition from the reverse conducting state into the forward conducting state, and vice versa, based on a voltage drop across the load current paths of the first and, respectively, the second power transistors.

7. The integrated circuit of claim 1,
   wherein the control circuit is configured to trigger a switch-off of the second power transistor, or both the first and second power transistors, in response to the error signal.

8. A method comprising:
   switching on a first power transistor and a second power transistor, which are connected back-to-back, based on an input signal, wherein the first and the second power transistors each have an intrinsic body diode which allows reverse conduction;
   providing load current to a load connected to the second power transistor;
   generating an error signal when detecting a transition from a reverse conducting state into a forward conducting state for the second power transistor and a transition from a forward conducting state into a reverse conducting state for the first power transistor.

9. The method of claim 8,
   wherein the error signal is generated when detecting the transition from a reverse conducting state into a forward conducting state for the second power transistor immediately followed by the transition from a forward conducting state into a reverse conducting state for the first power transistors.

10. The method of claim 8, further comprising:
    generating a first current sense signal that represents a load current passing through the first power transistor when in a forward conducting state, and generating a second current sense signal representing a load current passing through the second power transistor when in a forward conducting state.

11. The method of claim 10, wherein the first and the second current sense signals are zero when the first and, respectively, second power transistors are in a reverse conducting state.

12. The method of claim 10, wherein generating the error signal comprises:
detecting, for the first and the second power transistors, the transition from the reverse conducting state into the forward conducting state, and vice versa, based on the first and, respectively, the second current sense signals.

13. The method of claim 8, wherein generating the error signal comprises:
detecting, for the first and the second power transistors, the transition from the reverse conducting state into the forward conducting state, and vice versa, based on a voltage drop across the load current paths of the first and, respectively, the second power transistors.

14. The method of claim 8, further comprising:
triggering a switch-off of the second power transistor, or both power transistors, in response to the error signal.

* * * * *